(12) United States Patent
Chuang et al.

(10) Patent No.: US 8,846,510 B2
(45) Date of Patent: Sep. 30, 2014

(54) METHOD AND STRUCTURE TO BOOST MOSFET PERFORMANCE AND NBTI

(71) Applicant: Taiwan Semiconductor Manufacturing Company, Ltd., Hsin-Chu (TW)

(72) Inventors: Harry-Hak-Lay Chuang, Singapore (SG); Po-Nien Chen, Miaoli (TW); Wei Cheng Wu, Zhubei (TW); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/774,663

(22) Filed: Feb. 22, 2013

(65) Prior Publication Data

US 2014/0103429 A1 Apr. 17, 2014

Related U.S. Application Data

(60) Provisional application No. 61/713,942, filed on Oct. 15, 2012.

(51) Int. Cl.
*H01L 21/425* (2006.01)
*H01L 29/78* (2006.01)
*H01L 29/66* (2006.01)

(52) U.S. Cl.
CPC ...... *H01L 29/66681* (2013.01); *H01L 29/7816* (2013.01)
USPC ............................ 438/527; 438/289; 257/335

(58) Field of Classification Search
USPC .......... 257/335, E21.346; 438/520, 527, 544, 438/923
See application file for complete search history.

(56) References Cited

U.S. PATENT DOCUMENTS

| 2001/0014500 | A1* | 8/2001 | Lee et al. ....................... 438/256 |
| 2009/0140242 | A1* | 6/2009 | Pawlak et al. .................. 257/43 |
| 2009/0267160 | A1* | 10/2009 | Ichise ............................ 257/369 |
| 2010/0233871 | A1* | 9/2010 | Chuang et al. ................ 438/527 |
| 2013/0075833 | A1* | 3/2013 | Liu et al. ...................... 257/411 |

* cited by examiner

*Primary Examiner* — Phuc Dang
(74) *Attorney, Agent, or Firm* — Haynes and Boone, LLP

(57) ABSTRACT

The present disclosure provides one embodiment of a method forming a p-type field effect transistor (pFET) structure. The method includes forming a mask layer on a semiconductor substrate, the mask layer including an opening that exposes a semiconductor region of the semiconductor substrate within the opening; forming a n-type well (n-well) in the semiconductor region by performing an ion implantation of a n-type dopant to the semiconductor substrate through the opening of the mask layer; and performing a germanium (Ge) channel implantation to the semiconductor substrate through the opening of the mask layer, forming a Ge channel implantation region in the n-well.

20 Claims, 5 Drawing Sheets

METHOD AND STRUCTURE TO BOOST MOSFET PERFORMANCE AND NBTI

CROSS-REFERENCE

This application claims priority to U.S. Provisional Patent Application Ser. No. 61/713,942, filed on Oct. 15, 2012, and entitled "Method And Structure To Boost MOSFET Performance And NBTI," the entire disclosure of which is hereby incorporated herein by reference.

BACKGROUND

Integrated circuits have progressed to advanced technologies with smaller feature sizes, such as 32 nm, 28 nm and 20 nm. In these advanced technologies, field-effect transistors (FETs) include three dimensional transistors each having a fin-like FET (FinFET) structure for enhanced device performance. In the FETs, gate stacks include metal for metal electrodes and high-k dielectric material for gate dielectric. However, existing methods and structures have various concerns and disadvantages associated with device performance and reliability. For example, charge scattering is a factor limiting the mobility and scalability of FETs in sub-40 nm technologies associated with metal electrode and high-K gate dielectric. In another example, a three dimensional FinFET structure is complex and expensive in term of cost and performance. Other examples include poor short-channel effect, and mismatch and variability due to dopant fluctuation.

Therefore, there is a need for a structure and method for a FET device to address these concerns for enhanced performance and reduced fabrication cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
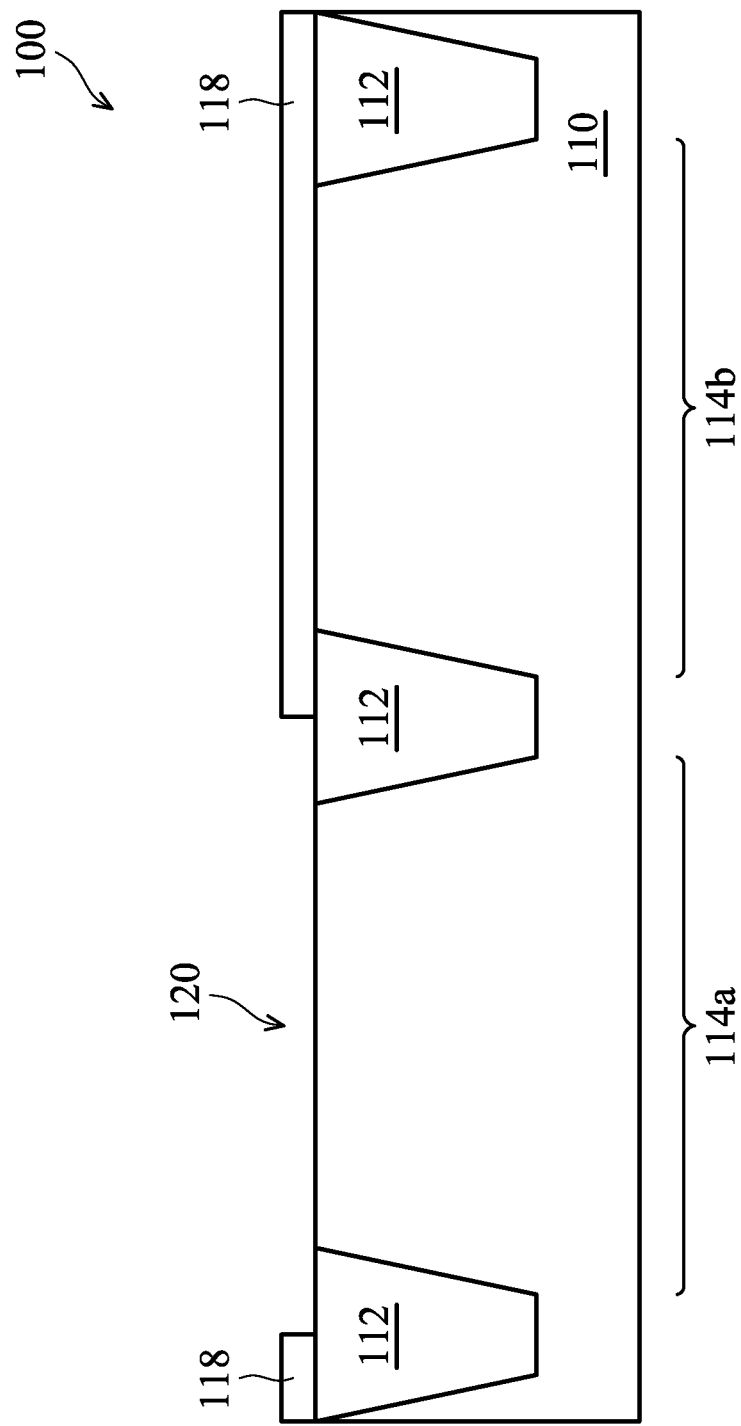
FIGS. 1-4 are sectional views of a semiconductor structure at various fabrication stages constructed according to one or more embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1-4 are sectional views of a semiconductor structure 100 at various fabrication stages constructed according to one or more embodiment. In one embodiment, the semiconductor structure 100 includes one or more field effect transistor (FET).

Referring to FIG. 1, the semiconductor structure 100 includes a semiconductor substrate 110. The semiconductor substrate 110 includes silicon. Alternatively, the substrate includes germanium, silicon germanium or other proper semiconductor materials. In another embodiment, the semiconductor substrate 110 includes a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

Various shallow trench isolation (STI) features 112 are formed in the semiconductor substrate 110 and define various semiconductor regions (or active regions) 114, such as semiconductor regions 114a and 114b. The semiconductor regions 114 are separated and isolated from each other by the STI features 114. In one example, the top surface of the semiconductor substrate 110 and the top surfaces of the STI features 112 may be coplanar, resulting in a common top surface. In one embodiment, the formation of the STI features 114 includes, forming a hard mask with openings that define the regions for STI features; etching the semiconductor substrate 110 through the openings of the hard mask to form trenches; depositing dielectric material to fill in the trenches; and performing a chemical mechanical polishing (CMP) process. As one embodiment for illustration, the depth of the STI features 112 ranges between about 30 nm and about 250 nm.

In one embodiment, the formation of the STI features 112 further includes removing the hard mask after CMP. In another embodiment, the hard mask includes a silicon oxide layer by thermal oxidation and a silicon nitride on the silicon oxide layer by chemical vapor deposition (CVD). In yet another embodiment, the hard mask is removed after the CMP process.

In another embodiment, the deposition of the dielectric material further includes thermal oxidation of the trenches and then filling in the trenches by the dielectric material, such as silicon oxide, by CVD. In one example, the CVD process to fill in the trenches includes high density plasma CVD (HDPCVD).

In one embodiment, the semiconductor region 114a is designed for a p-type FET (pFET) and the semiconductor region 114b is designed for an n-type FET (nFET).

Still referring to FIG. 1, a mask layer 118 is formed on the semiconductor structure 100 and patterned with one or more opening 120 designed for one or more n-type well (n-well) to be formed in some semiconductor regions 114. In the present embodiment, a n-well is to be formed in the semiconductor region 114a. The mask layer 118 resists ion implantation such that an ion implantation is only applied to the semiconductor region(s) within the opening 120 of the mask layer 118.

In one embodiment, the mask layer 118 is a hard mask and includes a dielectric material, such as silicon nitride (SiN), silicon oxide (SiO), silicon oxynitride (SiON) or a combination thereof. In one example, the hard mask includes a thermal silicon oxide film formed on the substrate 110 and a SiN film formed on the thermal silicon oxide film. In furtherance of the example, the thermal silicon oxide film layer is formed by a thermal oxidation process and the SiN film is formed by a CVD process. The hard mask is further patterned to form the opening 120 by a procedure including a lithography process and an etching process. In the present embodiment, a patterned resist layer is formed on the hard mask using a photolithography process including resist coating, soft baking, exposing, post-exposure baking (PEB), developing, and hard baking. Then, the hard mask is etched through the opening of the patterned resist layer, forming a patterned hard mask by the etching process. The patterned resist layer may be removed thereafter using a suitable process, such as wet stripping or plasma ashing. In one example, the etching process includes applying a dry (or plasma) etch to remove the hard mask within the opening of the patterned resist layer. In another example, the etching process includes applying a plasma etch to remove the SiN film within the opening of the patterned photoresist layer, and a wet etch with a hydrofluoric acid (HF) solution to remove the SiO film within the opening of the patterned resist layer.

In another embodiment, the mask layer 118 includes a resist material and a patterned resist layer is directly used as an implantation mask. Resist material is sensitive to photons and resists to ion implantation (alternatively or additionally resists to etch when used as an etch mask). In this case, the mask layer 118 is a patterned resist layer. The formation of the patterned resist layer is similar to that of the described resist layer to pattern the hard mask.

In the present embodiment of the lithography process, a photomask is used. The mask includes a pattern having various features and defining various regions for one or more n-wells. The photomask and the corresponding lithography process may utilize a suitable technology. In one example, the photomask is a binary photomask that includes a transparent substrate (of fused quartz in one example) and an opaque layer (of chromium in one example) disposed on the transparent substrate. The opaque layer is patterned to define the regions for n-wells. In other examples, the photomask may include a phase shift mask (PSM), or other suitable photomask.

In another embodiment, a lithography process may employ other suitable technologies, such as electron-beam (e-beam), to form a patterned resist layer. In this case, the resist material is sensitive to electrons. The photomask is eliminated and the resist layer is exposed in an e-beam direct write mode according to a pattern defined in a database. Other alternatively used lithography process may include ion lithography process or molecular imprint.

Figure 2:
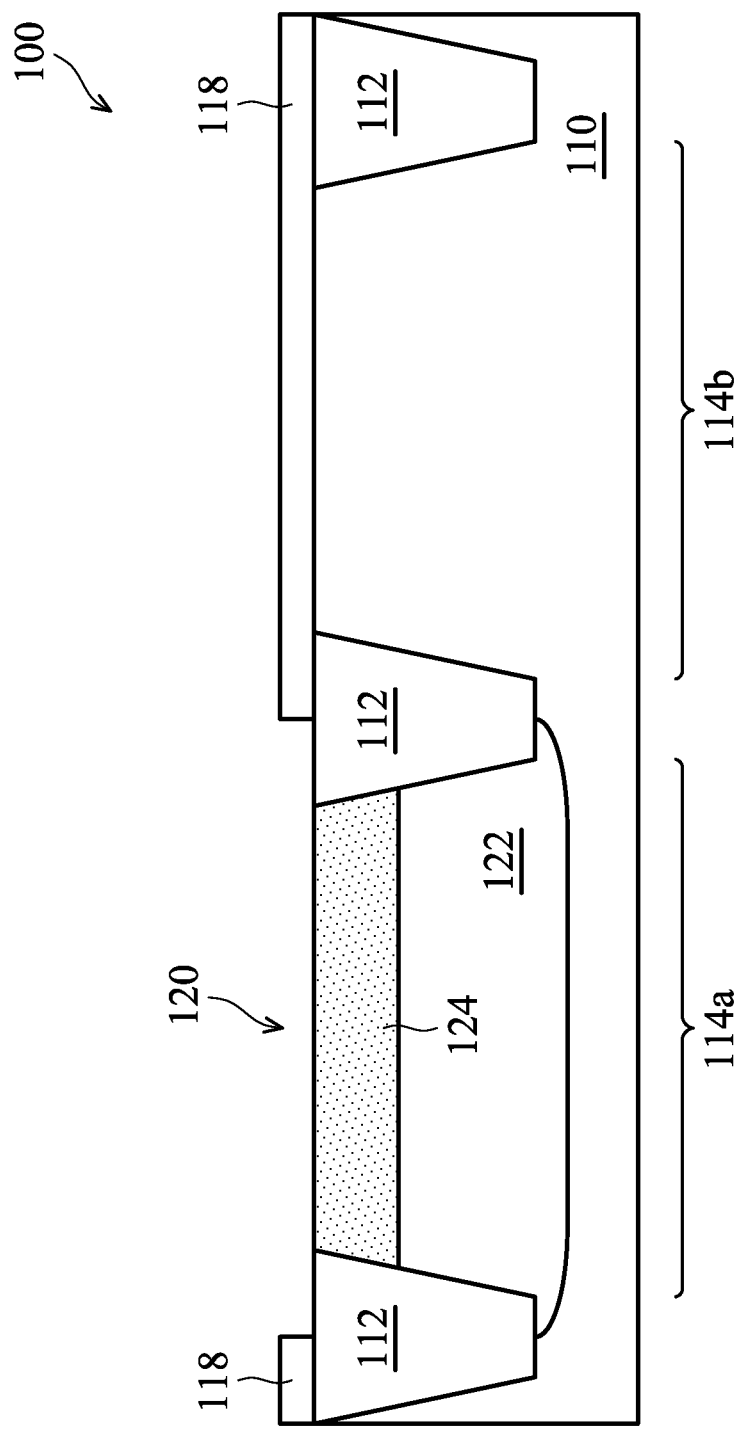

Referring to FIG. 2, an n-well 122 is formed in one or more semiconductor region 114. The n-well 122 includes an n-type dopant, such as phosphorous (P), distributed in an active region where a pFET is to be formed. The n-type dopant is introduced to the n-well 122 through the opening 120 of the mask layer 118 by a suitable doping process, such as one or more ion implantation. Since the mask layer 118 resists to the ion implantation, the ions are blocked by the mask layer 118 and are only introduced to the semiconductor regions within the openings of the mask layer 118. In the present example for illustration, the n-well 122 is formed in the semiconductor region 114a. In one example, the n-well 122 may have a corresponding doping concentration ranging between about $10^{16}$ and $10^{18}$ cm$^{-3}$. In another example, the n-well 122 may have a thickness ranging between about 0.5 micrometers and 2 micrometers.

Still referring to FIG. 2, a germanium (Ge) channel implantation process is applied to introduce Ge into the substrate 110 using the same mask layer 118, resulting in one or more channel implantation region 124 in the semiconductor substrate 110. Since the Ge channel implantation process is performed using the same mask layer 118 that is used to form the n-well 122, the channel implantation region 124 is formed in the corresponding semiconductor region where the n-well 122 is formed. State differently, the Ge channel implantation region 124 is formed in the n-well 122.

The Ge channel implantation region 124 is formed by one or more ion implantation. Ge is introduced into the semiconductor substrate 110 within the opening 120 of the mask layer 118. After the diffusion and subsequent annealing caused diffusion, the dopant Ge is distributed in the corresponding n-well 122 from the top surface to a certain depth (Ge depth). In one example, the Ge channel implantation region 124 extends from the top surface of the semiconductor substrate 110 to the n-well 122 with the Ge depth ranging between about 6 nm and about 12 nm. Especially, the Ge doping profile in the vertical direction (the direction perpendicular to the top surface of the semiconductor substrate 110) is non-uniform. In the Ge doping concentration profile in the vertical direction, the maximum doping concentration is at about half of the Ge depth. The Ge doping concentration decreases from the highest doping concentration when approaching to the top surface of the semiconductor substrate and approaching to the Ge depth. In one embodiment, the Ge doping concentration, in average, ranges between about $4 \times 10^{14}$ and about $10^{16}$ cm$^{-2}$. Particularly, the Ge atom concentration in the Ge channel implantation region 124 is less than about 3%.

The dopant Ge is introduced to the Ge channel implantation region 124 by an ion implantation. In one embodiment, the Ge implantation dose in the Ge implantation process is designed in a range between about $5 \times 10^{14}$ and about $10^{16}$ cm$^{-2}$. In another embodiment, the Ge channel implantation region 124 is formed by one ion implantation with plasma energy ranging between about 2 KeV and about 15 KeV.

The Ge channel implantation region 124 is designed to change the composition of the channel region of the pFET such that the corresponding work function is tuned for enhanced device performance, such as reduced threshold voltage of the pFET. The Ge doping concentration is designed in consideration of the proper work function of the channel region. As Ge is introduced by ion implantation instead of epitaxy growth, the fabrication cost is reduced. Particularly, the same mask layer 118 used as an implantation mask in forming the n-well 122 is also used as an implantation mask in the Ge channel implantation, there are no additional lithography process and other process steps. The corresponding fabrication procedure is simple and the manufacturing cycle time is reduced.

Figure 3:
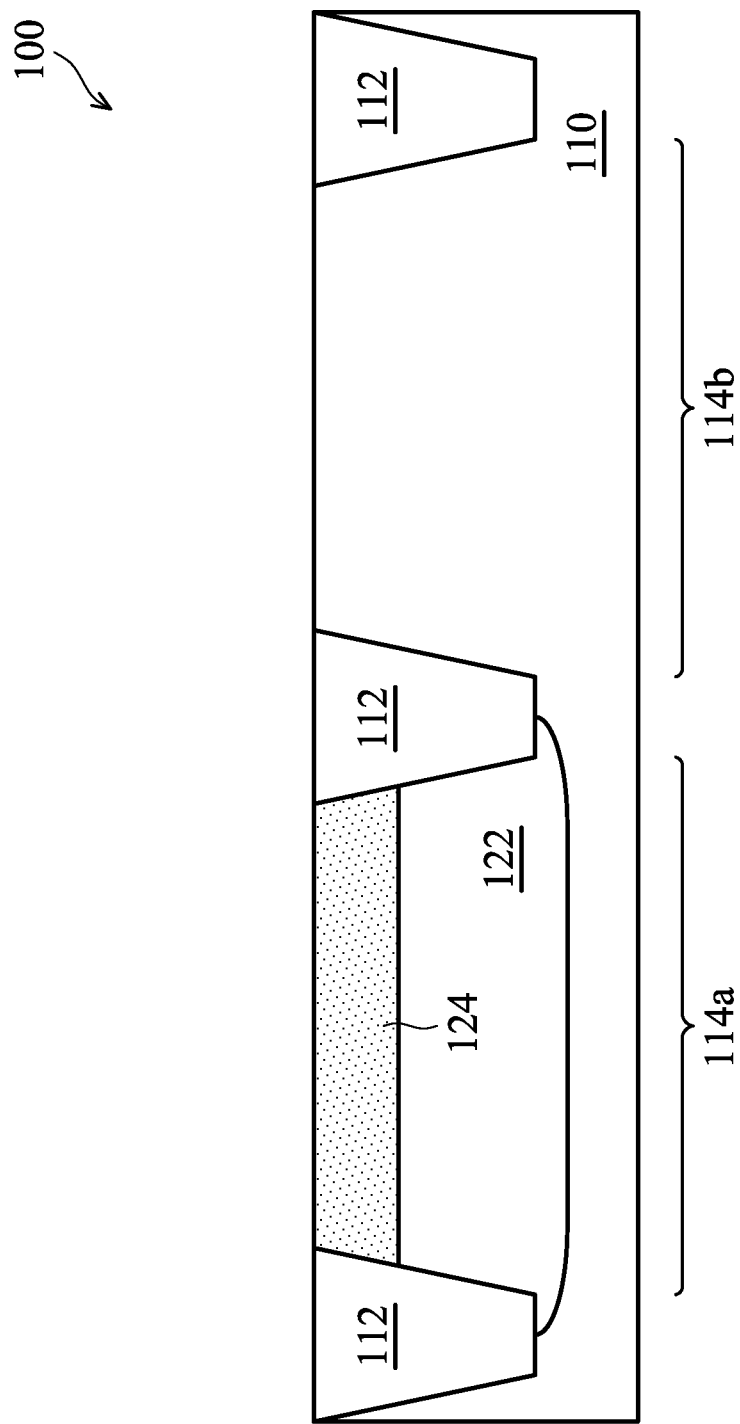

Referring to FIG. 3, after the formation of the n-well 122 and the Ge channel implantation region 124, the mask layer 118 may be removed by a suitable process, such as wet etch.

Other operations follow to form other features for the pFET in the semiconductor region 114a and are described below with reference to FIG. 4. For simplicity, only the semiconductor region 114a is illustrated.

A gate stack 130 is formed on the semiconductor region 114a. The gate stack 130 includes a gate dielectric feature 132 disposed on the semiconductor substrate 110 and a gate electrode 134 disposed on the gate dielectric. The semiconductor structure 100 may further include gate spacers 136 disposed on sidewalls of the gate stack 130.

The gate dielectric feature 132 includes a gate dielectric material, such as silicon oxide or a suitable dielectric material having a higher dielectric constant (high-k dielectric material). In the present embodiment, the gate dielectric feature 132 includes more than one dielectric material layers. For example, the gate dielectric feature 132 includes an interfacial dielectric layer, such as silicon oxide, and a high-k dielectric material layer on the interfacial layer. The gate electrode 134 includes a conductive material layer, such as doped polysilicon, metal, metal alloy, and/or metal silicide. In one embodiment, the gate electrode 134 includes more than one conductive material layers. For example, the gate electrode 134 includes a first conductive layer having a suitable work function on the gate dielectric feature 132 and a second conductive layer on the first conductive layer. In one example, the first conductive layer includes tantalum nitride or titanium nitride. In another example, the second conductive layer includes aluminum, tungsten, copper, doped polysilicon or combinations thereof. The gate spacers 136 are formed by deposition and anisotropic etch (such as dry etch). The gate spacers 136 include a dielectric material, such as silicon oxide, silicon carbide, silicon nitride, or silicon oxynitride.

In various embodiments, the gate stack 130 is formed by a gate-first process or a gate last process. In the gate-first process, a gate dielectric layer is deposited on the semiconductor substrate 110 and a gate electrode layer is deposited on the gate dielectric layer, a procedure including a lithography process and an etch process is implemented to pattern the gate dielectric layer and the gate electrode layer to form the gate stack. In the gate-last process, a dummy gate stack is formed by deposition and patterning; an interlayer dielectric (ILD) material is formed on the dummy gate stack by deposition and polishing, such as chemical mechanical polishing (CMP); and the dummy gate is removed and gate stack 130 is formed by a suitable procedure, such as a procedure including deposition and CMP. In furtherance of the gate-last process, when the dummy gate is removed, either dummy gate stack including corresponding gate dielectric and gate electrode is completely removed or only partially removed (such as only gate electrode is removed).

Figure 4:
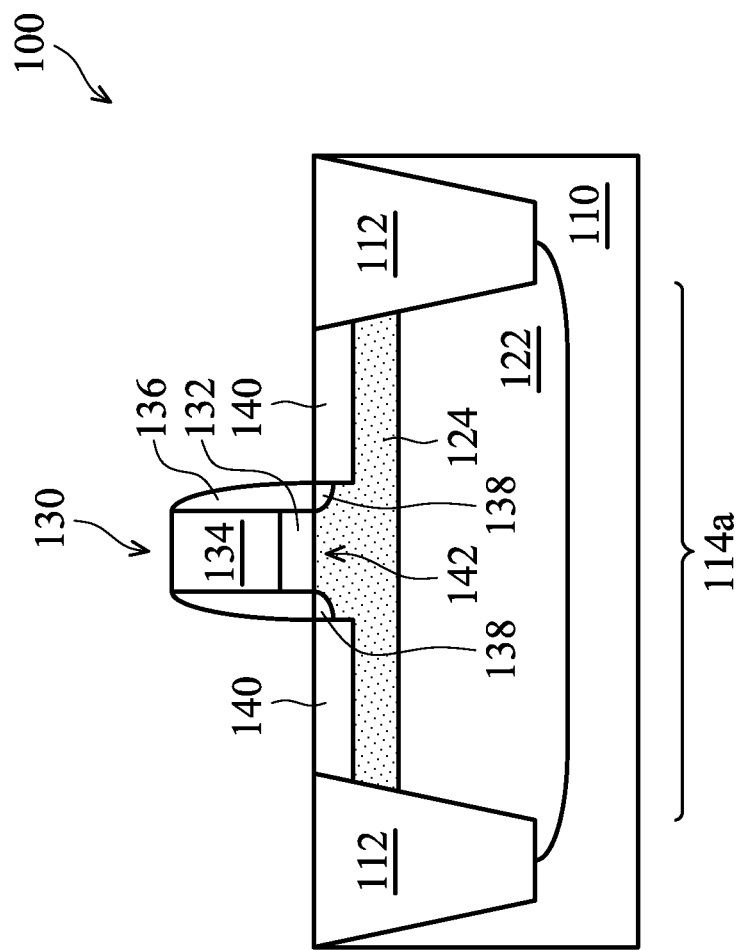

Still referring to FIG. 4, source and drain are formed in the n-well by one or more ion implantation of p-type dopant, such as boron (B). In the present embodiment, the source and drain include light doped drain (LDD) features 138 and heavily doped source and drain (S/D) features 140. In one embodiment, the LDD features 138 are formed by one ion implantation; the gate spacers 136 are formed on the sidewalls of the gate stack (the gate stack 130 in the gate-first process or the dummy gate stack in the gate-last process); then heavily doped S/D features 140 are formed by another ion implantation. Thus the heavily doped S/D features 140 are offset from the LDD features 138 by the gate spacers 136. A thermal annealing process may follow for activation. A channel region 142 is defined in the Ge channel implantation region 124 between the source and drain. Specifically, the channel region 142 is interposed between the LDD features 138. The channel region 142 is Ge doped and is therefore referred to as Ge doped channel region 142 as well.

Thus formed pFET in the semiconductor region 114a includes the n-well 122, the Ge channel region 142, the source and drain, the gate stack 130. Various advantages may be present in different embodiments. In one embodiment, by the Ge channel implantation, the work function of the channel region 142 is properly tuned for the improved device performance. In another embodiment, by the Ge channel implantation, the short channel effect is reduced or eliminated. In yet another embodiment, by the Ge channel implantation, the experiments found that the dopant fluctuation is reduced and accordingly, the variation of device performance from transistor to transistor is reduced. In yet another embodiment, the negative bias temperature instability (NBTI) is substantially reduced, where NBTI causes reliability issues in the pFET. In yet another embodiment, the charge scattering is reduced by the Ge channel implantation. Accordingly the carrier mobility in the pFET is enhanced. In yet another embodiment, the drain effective current $I_{deff}$ and the source off current $I_{soff}$ are improved as well by the Ge channel implantation. Furthermore, the disclosed pFET and the corresponding method enhance the scalability of the pFET structure and extend planar FET structure to advanced technology nodes (such as sub-40 nm FET technology with high-k dielectric and metal gate).

Other features may be formed by corresponding operations. In one example, an ILD material is formed by a deposition technique, such as chemical vapor deposition (CVD) and polishing (by CMP to planarize the top surface). In another embodiment, an interconnect structure is formed and include various conductive features (such as metal lines, contact features and via features) configured to couple various devices to form a functional circuit.

Figure 5:
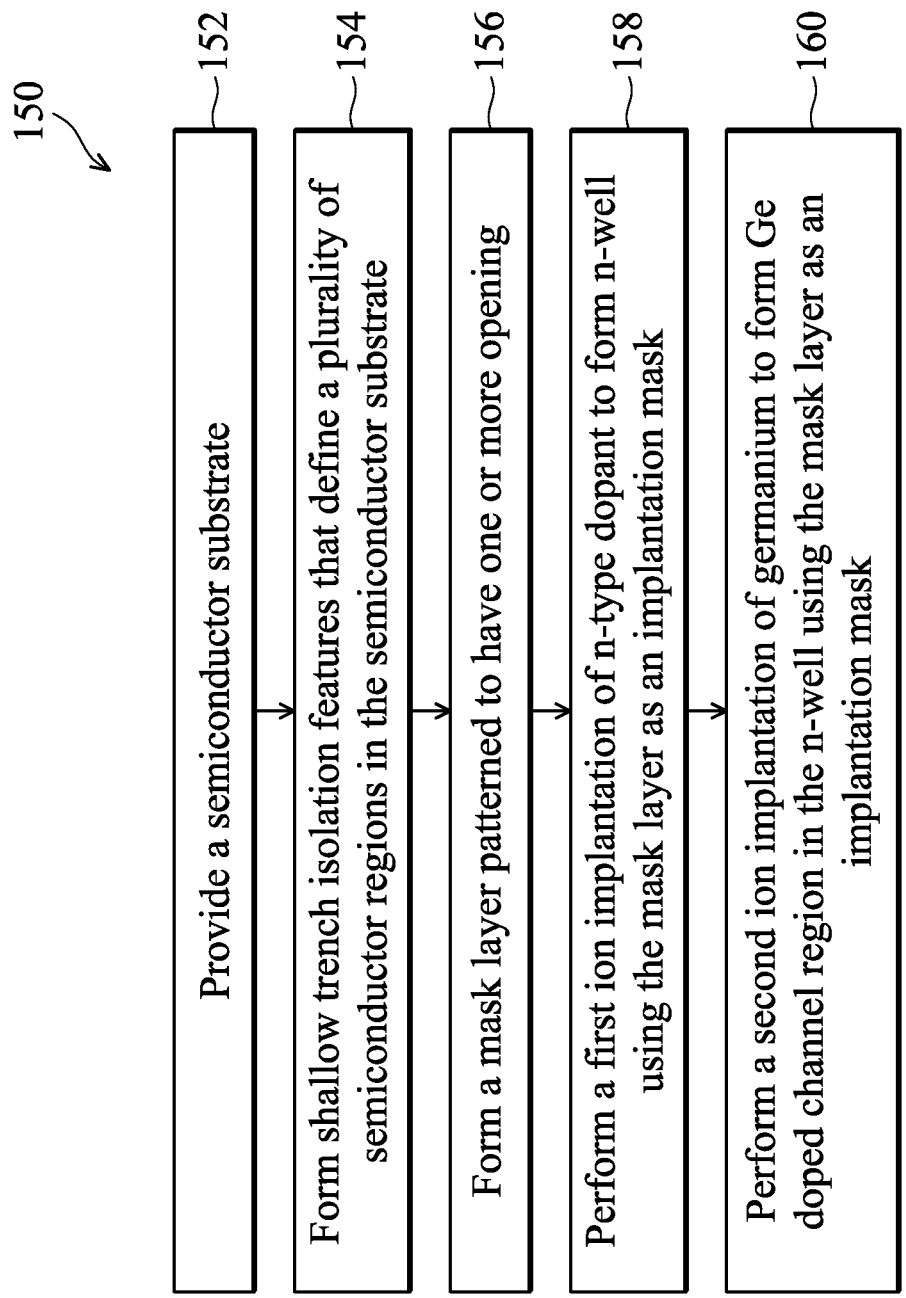
FIG. 5 is a flowchart of a method making a semiconductor structure of FIG. 4 constructed according to various aspects of the present disclosure in one embodiment.

FIG. 5 is a flowchart of a method 150 to form a pFET constructed according to various aspects of the present disclosure in one or more embodiments. The method 150 includes an operation 152 by providing a semiconductor substrate 110, such as a silicon wafer.

The method 150 includes an operation 154 by forming a plurality of STI features to define various semiconductor regions separated from each other by the STI features. In one example, the STI features are formed in a processing sequence including forming a patterned mask layer on the semiconductor substrate, etching the semiconductor substrate to form trenches through the openings of the patterned mask layer, depositing a dielectric material to fill in the trenches, and planarizing the top surface by CMP.

The method 150 includes an operation 156 by forming a mask layer patterned to have one or more opening such that the underlying semiconductor substrate is exposed within the opening. The mask layer is used as an ion implantation mask for subsequent ion implantation processes. In one embodiment, the mask layer is a hard mask having a dielectric material and is formed by a procedure that includes deposition, lithography process and etching. For example, a dielectric material (silicon oxide, silicon nitride, silicon oxynitride or combination) layer is deposited, a patterned resist layer is formed on the dielectric material layer, and an etch process is applied to remove the dielectric material layer within the opening of the resist layer. The patterned resist layer is removed afterward. The patterned resist layer is formed by a lithography process that includes coating, exposing, and developing. In another embodiment, the mask layer includes a patterned resist layer.

The method 150 includes an operation 158 by performing a first ion implantation to the semiconductor substrate to form a n-well using the mask layer as an ion implantation mask. The first ion implantation utilizes n-type dopant, such as phosphorous.

The method 150 includes an operation 160 by performing a second ion implantation (or Ge channel implantation process) to the semiconductor substrate to form a Ge channel implantation region in the n-well using the same mask layer as an ion implantation mask. The second ion implantation utilizes Ge dopant. The Ge channel implantation process is applied to introduce Ge into the n-well, resulting in a Ge channel implantation region in the n-well. Particularly, the Ge channel implantation process is performed using the same mask layer that is used to form the n-well.

In one example, the Ge channel implantation region extends from the top surface of the semiconductor substrate to the n-well with the Ge depth ranging between about 6 nm and about 12 nm. Especially, the Ge doping profile in the vertical direction (the direction perpendicular to the top surface of the semiconductor substrate) is non-uniform. In the Ge doping concentration profile in the vertical direction, the maximum doping concentration is at about half of the Ge depth. The Ge doping concentration decreases from the highest doping concentration when approaching to the top surface of the semiconductor substrate and approaching to the Ge depth.

In one embodiment, the Ge doping concentration, in average, ranges between about $4 \times 10^{14}$ and about $10^{16}$ cm$^{-2}$. Particularly, the Ge atom concentration in the Ge channel implantation region is less than about 3%.

In another embodiment, the Ge implantation dose in the Ge implantation process is designed in a range between about $5 \times 10^{14}$ and about $10^{16}$ cm$^{-2}$. In yet another embodiment, the Ge channel implantation region is formed by one ion implantation with plasma energy ranging between about 2 KeV and about 15 KeV.

In one embodiment, the method 150 may include an operation to remove the mask layer after the first and second ion implantations. In another embodiment, the method 150 includes an operation to form a gate stack on the n-well. The gate stacks include a gate dielectric layer and gate electrode layer. The formation of the gate stacks includes deposition and patterning that further includes lithography process and etch. The gate stack may include high-k dielectric material and metal electrode formed in a gate-first process or a gate-last process according to various examples. In another embodiment, the method 150 includes an operation to form source and drain of the p-type dopant in the n-well. In one example, the source and drain light doped drain (LDD) features and heavily doped source and drain (S/D) features, formed by various ion implantation processes. Thus formed pFET includes the n-well, the source and drain, and the gate stack. Especially, the pFET includes a channel region that is Ge doped.

Other fabrication steps may be implemented before, during and after the operations of the method. In one embodiment, an inter-level dielectric (ILD) layer is formed on the semiconductor substrate. The ILD layer includes silicon oxide, low k dielectric material, other suitable dielectric materials, or combinations thereof. The ILD layer is formed by a suitable technique, such as CVD. For example, high density plasma CVD may be implemented to form the ILD layer.

In another embodiment, the method further includes a procedure to form various interconnection features designed to couple various devices (including the pFET) to form a functional circuit. The interconnection features include vertical interconnects, such as contacts and vias, and horizontal interconnects, such as metal lines. The various interconnection features may use various conductive materials including copper, tungsten and silicide. In one example, a damascene process is used to form copper-based multilayer interconnection structure. In another embodiment, tungsten is used to form tungsten plug in the contact holes. In another example, silicide is used to form various contact on source and drain regions for reduced contact resistance.

The present disclosure may be used in various applications, such as logic circuit, dynamic random access memory (DRAM), static random access memory (SRAM) cells, flash memory, or imaging sensor. As an example for illustration, an inverter ring oscillator may incorporate the pFET structure formed by the method 150.

Thus, the present disclosure provides a method of forming a p-type field effect transistor (pFET) structure. The method includes forming a mask layer on a semiconductor substrate, the mask layer including an opening that exposes a semiconductor region of the semiconductor substrate within the opening; forming a n-type well (n-well) in the semiconductor region by performing an ion implantation of a n-type dopant to the semiconductor substrate through the opening of the mask layer; and performing a germanium (Ge) channel implantation to the semiconductor substrate through the opening of the mask layer, forming a Ge channel implantation region in the n-well.

In one embodiment, the method further includes forming a plurality of shallow trench isolation (STI) features in the semiconductor substrate, thereby defining the semiconductor region separated from other semiconductor regions by the STI features.

In another embodiment, the method further includes removing the mask layer after the forming of the n-well and the performing of the Ge channel implantation.

In yet another embodiment, the method further includes forming a gate stack on the semiconductor substrate and within the semiconductor region; and forming source and drain features of a p-type dopant in the n-type well and interposed by the gate stack. The gate stack may include a gate dielectric having a high k dielectric material and a gate electrode having a metal material. The gate stack may be formed by one of a gate-first process and a gate-last process.

In yet another embodiment, the mask layer includes a dielectric material selected from the group consisting of silicon oxide, silicon nitride, silicon oxynitride and a combination thereof. In yet another embodiment, the mask layer includes a resist material.

In yet another embodiment, the forming of the mask layer includes depositing a mask material film on the semiconductor substrate; and patterning the mask material film to form a mask layer having the opening by a lithography process.

In yet another embodiment, the performing of the Ge channel implantation includes performing a Ge ion implantation process that uses Ge dopant with a bias power ranging between about 2 KeV and about 15 KeV.

In yet another embodiment, the performing of the Ge channel implantation includes performing a Ge ion implantation process that uses Ge dopant with a doping dose ranging between about $5 \times 10^{14}$/cm$^2$ and about $10^{16}$/cm$^2$.

The present disclosure also provides another embodiment of a method to form a pFET structure. The method includes forming a plurality of shallow trench isolation (STI) features in a semiconductor substrate, thereby defining a semiconductor region of the semiconductor substrate separated from other semiconductor regions by the STI features; forming a mask layer on the semiconductor substrate, the mask layer is patterned to have an opening that exposes the semiconductor region therewithin; performing a first ion implantation of a n-type dopant to the semiconductor substrate through the opening of the mask layer, forming a n-type well (n-well) in the semiconductor region; and performing a second ion implantation of germanium (Ge) to the semiconductor substrate through the opening of the mask layer, forming a Ge channel implantation region in the n-well.

In one embodiment, the method includes forming a gate stack on the semiconductor substrate and within the semiconductor region, further includes forming source and drain features of a p-type dopant in the n-well and interposed by the gate stack. The gate stack may include a gate dielectric having a high k dielectric material and a gate electrode having a metal material.

In yet another embodiment, the forming of the mask layer includes depositing a mask material on the semiconductor substrate; and patterning the mask material to form a mask layer having the opening by a lithography process. The mask material may include one of a dielectric material and a resist material.

In yet another embodiment, the performing of the Ge channel implantation includes performing a Ge ion implantation process that uses Ge dopant with a bias power ranging between about 2 KeV and about 15 KeV and a doping dose ranging between about $5 \times 10^{14}/cm^2$ and about $10^{16}/cm^2$.

The present disclosure also includes an embodiment of a p-type field-effect transistor (pFET) structure that includes a n-well of a n-type dopant formed in a semiconductor substrate; a channel region formed in the n-well; a gate stack formed on the channel region; source and drain features formed in the n-well and interposed by the channel region; and wherein the channel region includes germanium (Ge) with an atom concentration less than about 3%.

In one embodiment, the channel region includes a non-uniform Ge doping concentration in a direction perpendicular to the semiconductor substrate, wherein a maximum Ge doping concentration is away from a top surface of the semiconductor substrate; and an average Ge doping concentration ranges between about $4 \times 10^{20}/cm^3$ and about $1.5 \times 10^{22}/cm^3$.

In another embodiment, the gate stack includes a high k dielectric material layer and a metal layer on the high k dielectric material layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a p-type field effect transistor (pFET) structure, the method comprising:
    forming a mask layer on a semiconductor substrate, the mask layer including an opening that exposes a semiconductor region of the semiconductor substrate within the opening;
    forming a n-type well (n-well) in the semiconductor region by performing an ion implantation of a n-type dopant to the exposed semiconductor region of the semiconductor substrate through the opening of the mask layer; and
    performing a germanium (Ge) channel implantation to the exposed semiconductor region of the semiconductor substrate through the opening of the mask layer, forming a Ge channel implantation region in the n-well, wherein the exposed semiconductor region remains uncovered during the performing of the Ge channel implantation.

2. The method of claim 1, further comprising forming a plurality of shallow trench isolation (STI) features in the semiconductor substrate, thereby defining the semiconductor region separated from other semiconductor regions by the STI features.

3. The method of claim 1, further comprising removing the mask layer after the forming of the n-well and the performing of the Ge channel implantation.

4. The method of claim 1, further comprising:
    forming a gate stack on the semiconductor substrate and within the semiconductor region; and
    forming source and drain features of a p-type dopant in the n-type well and interposed by the gate stack.

5. The method of claim 4, wherein the gate stack includes a gate dielectric having a high k dielectric material and a gate electrode having a metal material.

6. The method of claim 4, wherein the gate stack is formed by one of a gate-first process and a gate-last process.

7. The method of claim 1, wherein the mask layer includes a dielectric material selected from the group consisting of silicon oxide, silicon nitride, silicon oxynitride and a combination thereof.

8. The method of claim 1, wherein the mask layer includes a resist material.

9. The method of claim 1, wherein the forming of the mask layer includes
    depositing a mask material film on the semiconductor substrate; and
    patterning the mask material film to form a mask layer having the opening by a lithography process.

10. The method of claim 1, wherein the performing of the Ge channel implantation includes performing a Ge ion implantation process that uses Ge dopant with a bias power ranging between about 2 KeV and about 15 KeV.

11. The method of claim 1, wherein the performing of the Ge channel implantation includes performing a Ge ion implantation process that uses Ge dopant with a doping dose ranging between about $5 \times 10^{14}/cm^2$ and about $10^{16}/cm^2$.

12. The method of claim 1, wherein the performing of the Ge channel implantation includes performing a Ge ion implantation process that uses Ge dopant with a bias power ranging between about 2 KeV and about 15 KeV and a doping dose ranging between about $5 \times 10^{14}/cm^2$ and about $10^{16}/cm^2$.

13. A method, comprising:
    forming a plurality of shallow trench isolation (STI) features in a semiconductor substrate, thereby defining a first semiconductor region of the semiconductor substrate separated from other semiconductor regions by the STI features, wherein the first semiconductor region extends from a first STI feature to a second STI feature;
    forming a mask layer on the semiconductor substrate, the mask layer is patterned to have an opening that exposes the semiconductor region therewithin;
    performing a first ion implantation of a n-type dopant to the semiconductor substrate through the opening of the mask layer, forming a n-type well (n-well) in the semiconductor region; and
    performing a second ion implantation of germanium (Ge) to the semiconductor substrate through the opening of the mask layer, forming a Ge channel implantation region in the n-well, wherein the Ge channel implantation region extends from the first STI feature to the second STI feature.

14. The method of claim 13, further comprising:
    forming a gate stack on the semiconductor substrate and within the semiconductor region; and
    forming source and drain features of a p-type dopant in the n-type well and interposed by the gate stack.

15. The method of claim 14, wherein the gate stack includes a gate dielectric having a high k dielectric material and a gate electrode having a metal material.

16. The method of claim 14, wherein the forming of the mask layer includes
    depositing a mask material on the semiconductor substrate; and
    patterning the mask material to form a mask layer having the opening by a lithography process.

17. The method of claim 16, wherein the mask material includes one of a dielectric material and a resist material.

18. A method comprising:
  forming a mask layer on a semiconductor substrate, the mask layer including an opening that exposes a semiconductor region of the semiconductor substrate within the opening;
  performing an ion implantation of a n-type dopant to the exposed semiconductor region of the semiconductor substrate through the opening of the mask layer to form a n-type well in the semiconductor substrate; and
  performing a germanium (Ge) implantation to the exposed semiconductor region of the semiconductor substrate through the opening of the mask layer to form a Ge channel implantation region in the n-well, wherein the channel region includes Ge with an atom concentration less than about 3%.

19. The method of claim 18, further comprising forming a first shallow trench isolation (STI) feature and a second STI feature in the substrate, wherein the Ge channel implantation region extends from the first STI feature to the second STI feature.

20. The method of claim 18, wherein the mask layer remains uncovered during the performing of the ion implantation of the n-type dopant and the performing of the germanium implantation.

* * * * *